/ ! " # $ % & ' ( ) * + , - . 0 1 2 3 4 5 6 7 8 9 : ; < = > ? @ A B C D E F G H I J K L M N O P Q R S T U V W X Y Z [ \ ] ^ _ ` a b c d e f g h i j k l m n o p q r s t u v w x y z { | } ~

US007759775B2

(12) United States Patent
Sun et al.

(10) Patent No.: US 7,759,775 B2
(45) Date of Patent: Jul. 20, 2010

(54) HIGH CURRENT SEMICONDUCTOR POWER DEVICE SOIC PACKAGE

(75) Inventors: Ming Sun, Sunnyvale, CA (US); Xiaotian Zhang, San Jose, CA (US); Lei Shi, Shanghai (CN)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 291 days.

(21) Appl. No.: 11/544,453

(22) Filed: Oct. 6, 2006

(65) Prior Publication Data

US 2008/0203548 A1    Aug. 28, 2008

Related U.S. Application Data

(63) Continuation-in-part of application No. 10/896,375, filed on Jul. 20, 2004, now Pat. No. 7,208,818.

(51) Int. Cl.
*H01L 23/495* (2006.01)
*H01L 23/52* (2006.01)
*H01L 23/48* (2006.01)

(52) U.S. Cl. .............................. 257/666; 257/E23.031; 257/E23.033; 257/E23.037; 257/E23.052; 257/E23.044; 257/E23.01; 257/E23.024; 257/E23.026; 257/672; 257/676; 257/675; 257/692

(58) Field of Classification Search ................. 257/672, 257/666, 676, 675, 692, E23.031, E23.033, 257/E23.037, E23.052, E23.044, E23.01, 257/E23.024, E23.026, 784, 786, 698, 696
See application file for complete search history.

(56) References Cited

U.S. PATENT DOCUMENTS 6,211,462 B1    4/2001    Carter et al.

| 6,249,041 | B1 | 6/2001 | Kasem et al. | |
| 6,291,262 | B1 | 9/2001 | Udagawa et al. | |
| 6,396,127 | B1 | 5/2002 | Munoz et al. | |
| 6,400,004 | B1 | 6/2002 | Fan et al. | |
| 6,593,622 | B2* | 7/2003 | Kinzer et al. | 257/341 |
| 6,873,041 | B1* | 3/2005 | Crowley et al. | 257/692 |
| 6,921,682 | B2 | 7/2005 | Janssen et al. | |
| 7,078,271 | B2* | 7/2006 | Mahle | 438/123 |
| 7,382,059 | B2* | 6/2008 | Anderson et al. | 257/787 |
| 2001/0048154 | A1 | 12/2001 | Cheah et al. | |
| 2003/0011051 | A1 | 1/2003 | Woodworth et al. | |
| 2003/0113954 | A1* | 6/2003 | Glenn et al. | 438/124 |

(Continued)

OTHER PUBLICATIONS

Chinese language Office action for Chinese patent application No. 200710147438.2, and English translation thereof, which corresponds to U.S. Appl. No. 10/896,375.

(Continued)

*Primary Examiner*—Alexander O Williams
(74) *Attorney, Agent, or Firm*—Schein & Cai LLP; James Cai

(57) ABSTRACT

A high current semiconductor power SOIC package is disclosed. The package includes a relatively thick lead frame formed of a single gauge material having a thickness greater than 8 mils, the lead frame having a plurality of leads and a first lead frame pad, the first lead frame pad including a die soldered thereto; a pair of lead bonding areas being disposed in a same plane of a top surface of the die; large diameter bonding wires connecting the die to the plurality of leads, the bonding wires being aluminum; and a resin body encapsulating the die, bonding wires and at least a portion of the lead frame.

13 Claims, 3 Drawing Sheets

U.S. PATENT DOCUMENTS

| | | | |
|---|---|---|---|
| 2004/0056355 A1 | 3/2004 | Minami et al. | |
| 2004/0104489 A1* | 6/2004 | Larking | 257/787 |
| 2005/0012183 A1 | 1/2005 | Chow et al. | |
| 2005/0145998 A1 | 7/2005 | Harnden et al. | |
| 2007/0111393 A1* | 5/2007 | Burghout et al. | 438/123 |
| 2007/0134851 A1* | 6/2007 | Harnden et al. | 438/123 |
| 2007/0145573 A1* | 6/2007 | Otremba | 257/718 |
| 2007/0200219 A1* | 8/2007 | Otremba | 257/692 |
| 2007/0215996 A1* | 9/2007 | Otremba | 257/678 |
| 2007/0284720 A1* | 12/2007 | Otremba et al. | 257/690 |
| 2008/0061413 A1* | 3/2008 | Otremba et al. | 257/676 |
| 2008/0105957 A1* | 5/2008 | Joshi et al. | 257/666 |
| 2008/0128876 A1* | 6/2008 | Liu et al. | 257/676 |
| 2008/0185696 A1* | 8/2008 | Madrid | 257/676 |
| 2009/0045493 A1* | 2/2009 | Yong et al. | 257/676 |

OTHER PUBLICATIONS

Search report of The Internationl Searching Authority concerning International Appl. No. PCT/US2005/025669 mailed on Mar. 28, 2006.

Written opinion of The Internationl Searching Authority concerning International Appl. No. PCT/US2005/025669 mailed on Mar. 28, 2006.

JP 11-204724 A (Mitsubishi Electric Corp) Jul. 30, 1999 (original in Japaness) See para [0089] of machine based abstract from the PAJ website.

JP 11-204724 A (Mitsubishi Electric Corp) Jul. 30, 1999 (translation in English) See para [0089] of machine based abstract from the PAJ website.

Zhang, Jason, "Choosing The Right Power MOSFET Package", International Rectifier [online]: http://irf.com/technical-info/whitepaper/mosfetpackageeepn0204.pdf [Feb. 2004].

\* cited by examiner

HIGH CURRENT SEMICONDUCTOR POWER DEVICE SOIC PACKAGE

CROSS REFERENCE TO RELATED APPLICATIONS

The present invention is a continuation in part application of Ser. No. 10/896,375, filed on Jul. 20, 2004, now U.S. Pat. No. 7,208,818 and entitled "Power Semiconductor Package", the disclosure of which is incorporated herein by reference in its entirety.

BACKGROUND OF THE INVENTION

The present invention generally relates to semiconductor devices, more particularly to a high current semiconductor device SOIC package.

Power semiconductor packages have evolved from through hole to surface mounted packages with the evolution of printed circuit board technology. Surface mounted packages generally include a lead frame on which a semiconductor device is mounted. The semiconductor device and a portion of the lead frame are generally encapsulated with a resin material. In a leaded package, lead terminals extend outside the resin body and include bonding pads for providing a wire bond connection from the semiconductor device to the lead terminal.

Major considerations in the packaging of semiconductor devices include high thermal dissipation, low parasitic inductance, low electrical resistance between the semiconductor device and the circuit environment, good reliability in terms of thermal cycling and thermal shock/fatigue, and minimal consumption of circuit board space.

Conventional power semiconductor packages include Small Outline Integrated Circuits (SOIC) packages with between 8 and 32 lead counts. In high current applications, conventional SOIC packages suffer from poor thermal performance due to lead frame thickness and package bottom encapsulation. Furthermore, semiconductor dies are conventionally attached to SOIC package lead frames using thermally poor materials such as Ag epoxy.

The use of conventional SOIC packages in many applications is further limited as the SOIC package footprint does not match the TO 252 (DPAK) land pattern on printed circuit boards. Additionally, conventional SOIC packages have an easily deformable lead frame resulting in lower assembly yield and relatively small wire bonding areas which limit the number of bonding wires that can be used to thereby reduce package electrical resistance.

SUMMARY OF THE INVENTION

The present invention solves the aforementioned problems by providing a high current semiconductor power device SOIC package. The novel SOIC package can be used in high current applications and used to replace TO 252 devices in many applications.

In accordance with one aspect of the invention, a high current semiconductor power SOIC package includes a relatively thick lead frame formed of a single gauge material having a thickness greater than 8 mils, the lead frame having a plurality of leads and a first lead frame pad, the first lead frame pad including a die soldered thereto; a pair of lead bonding areas being disposed in a same plane of a top surface of the die; large diameter bonding wires connecting the die to the plurality of leads, the bonding wires being aluminum; and a resin body encapsulating the die, bonding wires and at least a portion of the lead frame.

In accordance with another aspect of the invention, a flat-leaded high current semiconductor power device SOIC package housing an electronic device includes a relatively thick lead frame formed of a single gauge material having a thickness greater than 8 mils and including a plurality of leads and a lead frame pad, the lead frame pad having the electronic device soldered thereto; a pair of lead bonding areas disposed in a same plane of a top surface of the electronic device; bonding wires connecting the electronic device to the plurality of leads, the bonding wires being aluminum wires having a thickness up to 20 mils; and a resin body encapsulating the electronic device, bonding wires and at least a portion of the lead frame.

These and other features, aspects and advantages of the present invention will become better understood with reference to the following drawings, description and claims.

DETAILED DESCRIPTION OF THE INVENTION

The following detailed description is of the best modes of carrying out the invention. The description is not to be taken in a limiting sense, but is made merely for the purpose of illustrating the general principles of the invention, since the scope of the invention is best defined by the appended claims.

The present invention generally provides a high current semiconductor power device SOIC package having a lead frame formed of a single gauge material having a thickness greater than the conventional 8 to 10 mils. Advantageously, a thicker lead frame facilitates the bonding of larger diameter aluminum bonding wires. The use of aluminum bonding wires decreases package resistance dramatically over conventional gold wire configurations. Bonding wires may be up to 20 mils in diameter. A thicker lead frame material further provides for improved package thermal behavior by facilitating heat flow laterally out a drain lead. This is so even in a case where a bottom portion of the lead frame pad is exposed. Further, a source bonding area and a gate bonding area may be disposed at a substantially same height as a height of a die. In this manner, a short length of bonding wires may be used to thereby reduce electrical resistance and inductance.

The high current semiconductor power device SOIC package further comprises externally extending drain, source and gate leads that are match-able a TO 252 land pattern. The high current semiconductor power device SOIC package of the invention can therefore be used in place of a DPAK package in many high current applications.

Figure 1:
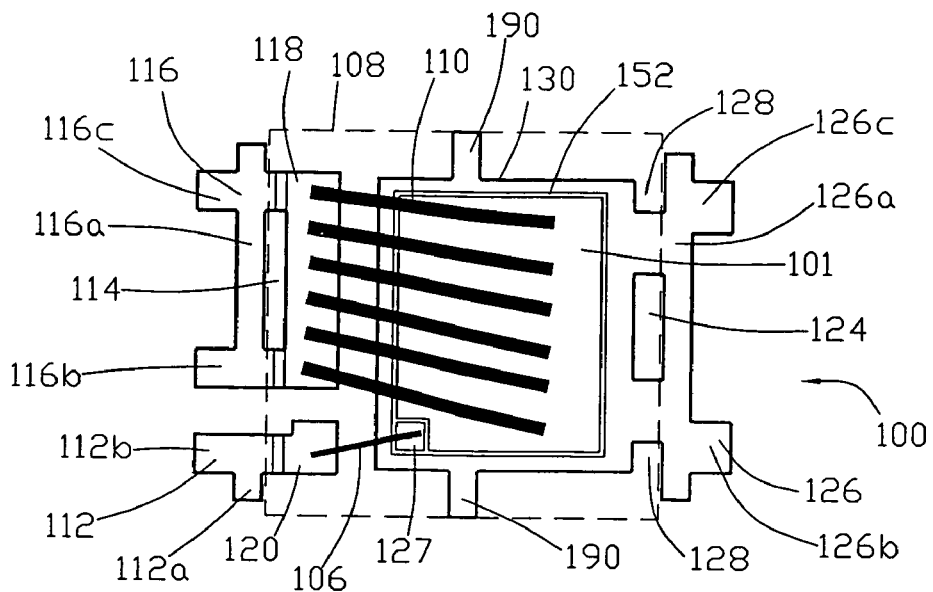
FIG. 1 is a top view of an embodiment of a high current semiconductor power device SOIC package in accordance with the present invention.
Figure 1A:
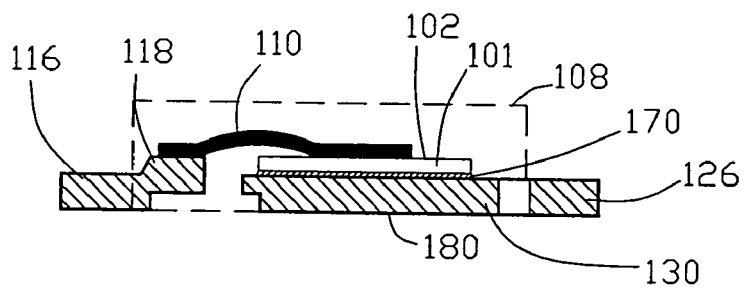
FIG. 1A is a cross sectional view of the high current semiconductor power device SOIC package of FIG. 1 in accordance with the present invention.
Figure 1B:
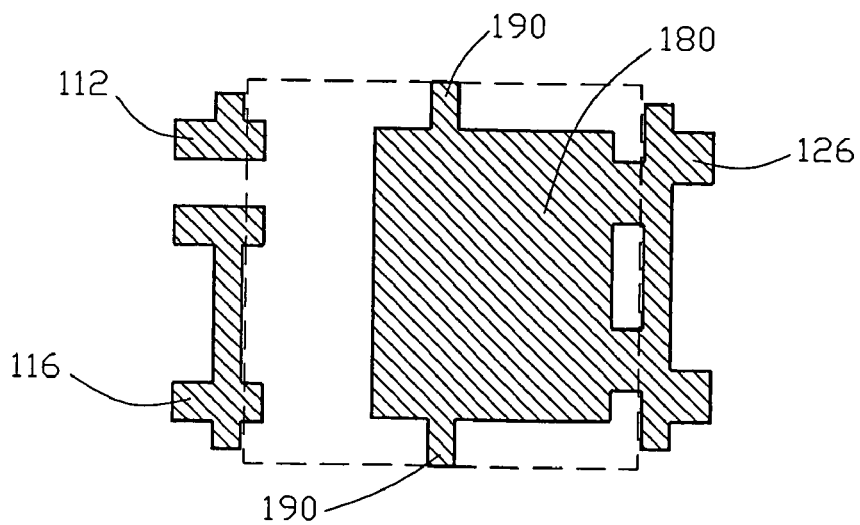
FIG. 1B is a bottom view of the high current semiconductor power device SOIC package of FIG. 1 in accordance with the present invention.

With reference to FIG. 1, FIG. 1A, and FIG. 1B, a high current semiconductor power device SOIC package generally designated 100 is shown. A thick, single gauge material lead frame 130 includes a lead frame pad 152 to which is coupled a die 101. The die 101 is preferably soldered to the lead frame pad 152 by means of a layer of solder 170 so as to facilitate the use of large diameter Al bonding wires. A portion of the lead frame 130 may be molded in a resin body 108.

The lead frame 130 includes a source lead 116, a gate lead 112 and a drain lead 126. Source lead 116 may be fused and extend externally of the resin body 108. The external portion of the source lead 116 further includes a laterally extending portion 116a and first and second portions 116b and 116c, the first and second portions 116b and 116c extending perpendicularly from the laterally extending portion 116a in spaced relationship one to the other. An internal source bonding area 118 is coupled to the die source contacts by means of bonding wires 110. Internal source bonding area 118 extends substantially the full length of the fused source lead 116 to provide a maximum number of bonding wires 110 to thereby reduce on-resistance and inductance. Drain lead 126 may be connected to the lead frame pad 152 and includes a laterally extending portion 126a and first and second portions 126b and 126c, the first and second portions 126b and 126c extending perpendicularly from the laterally extending portion 126a in spaced relationship one to the other. Gate lead 112 may be connected to a gate contact area 120 which in turn may be connected to a gate pad 127 by means of a bonding wire 106. The gate lead 112 further includes a laterally extending portion 112a and a portion 112b extending perpendicularly from the laterally extending portion 112a. A source locking hole 114 and a drain locking hole 124 may be formed in the source lead 116 and the drain lead 126 respectively. Locking notches 128 may be formed in the drain lead 126.

With particular reference to FIG. 1A, the lead frame 130 is formed of a single gauge material having a thickness greater than the conventional 8 to 10 mils. Advantageously, the thicker lead frame 130 facilitates the bonding of larger diameter aluminum bonding wires 110 and 106 and/or a greater number of such bonding wires. The use of large diameter aluminum bonding wires decreases package inductance and resistance dramatically over conventional gold wire configurations. Furthermore, the use of large diameter aluminum bonding wires enables the package 100 to be used in high current applications. Bonding wires 110 and 106 may be up to 20 mils in diameter. A thicker lead frame material further provides for improved package thermal behavior by facilitating heat flow laterally out the drain lead 126.

With continued reference to FIG. 1A, the source bonding area 118 and the gate bonding area 120 (not shown in this view) are disposed substantially in a same plane as a top surface 102 of the die 101. In this manner, a short length of bonding wires 110 and 106 can be used to thereby reduce electrical resistance and inductance. A bottom portion 180 of the lead frame 130 is exposed at the bottom of the package 100.

Figure 2:
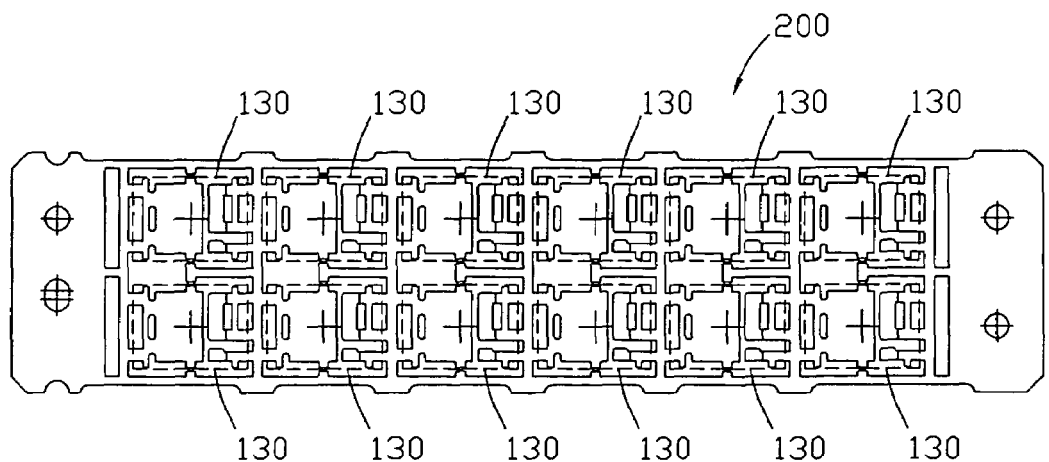
FIG. 2 is a top view of a matrix lead frame in accordance with the present invention.
Figure 2A:
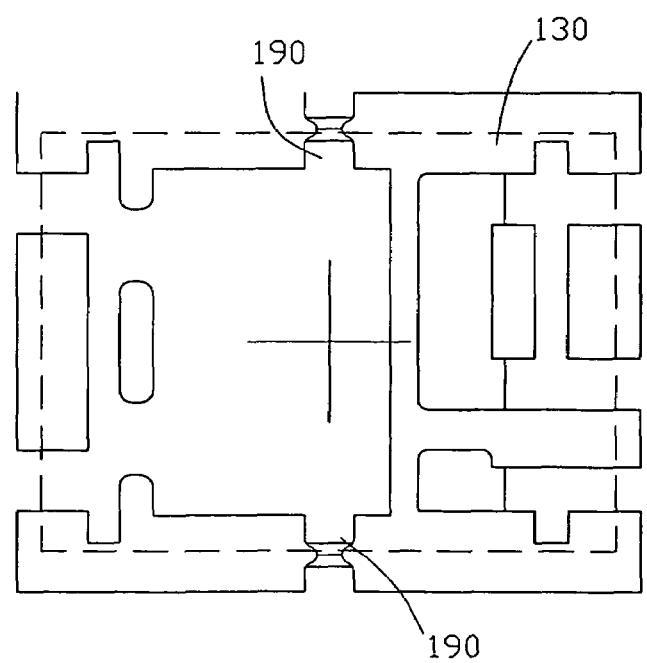
FIG. 2A is an enlarged view of one of the lead frames and its supports in accordance with the invention.

The lead frame 130 further includes a pair of side tie bars 190. Side tie bars 190 serve to strengthen a matrix lead frame 200 (FIG. 2 and FIG. 2A) mechanical properties and enable the thick lead frames 130 to be manufactured in the high density matrix lead frame 200 to thereby increase assembly yields and lower packaging costs. Side tie bars 190 further provide for greater molding adherence to the lead frame 130 and decreased moisture exposure to the die 101.

Figure 3:
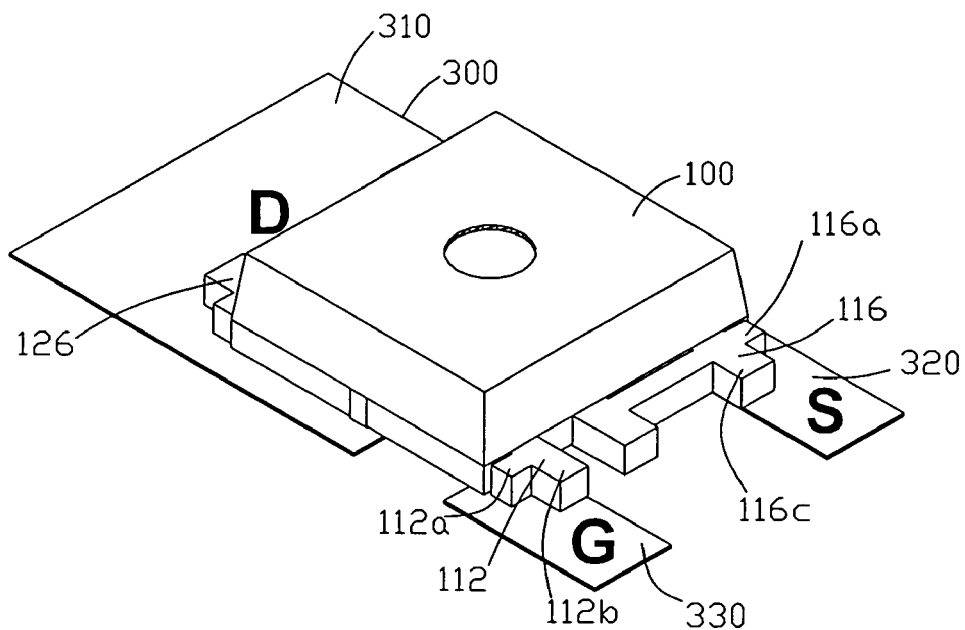
FIG. 3 is a perspective view of the high current semiconductor power device SOIC package surface mounted to a TO 252 land pattern in accordance with the invention.

FIG. 3 shows a TO 252 land pattern 300 including a drain area 310, a source area 320 and a gate area 330. A high current semiconductor power SOIC device 100 in accordance with the invention is shown surface mounted to the land pattern 300 with the drain lead 126 mounted to the drain area 310, a portion of the source 116, including the portion 116c and a part of the portion 116a, mounted to the source area 320 and the gate lead 112, including portions 112a and 112b, mounted to the gate area 330. The source portion 116c together with the gate portion 112b, when mounted to the source area 320 provide less resistivity and better thermal dissipation to the SOIC device 100. Furthermore, the source portion 116c and the gate portion 112b provide for matching of the SOIC device 100 to the TO 252 land pattern 300.

Figure 4:
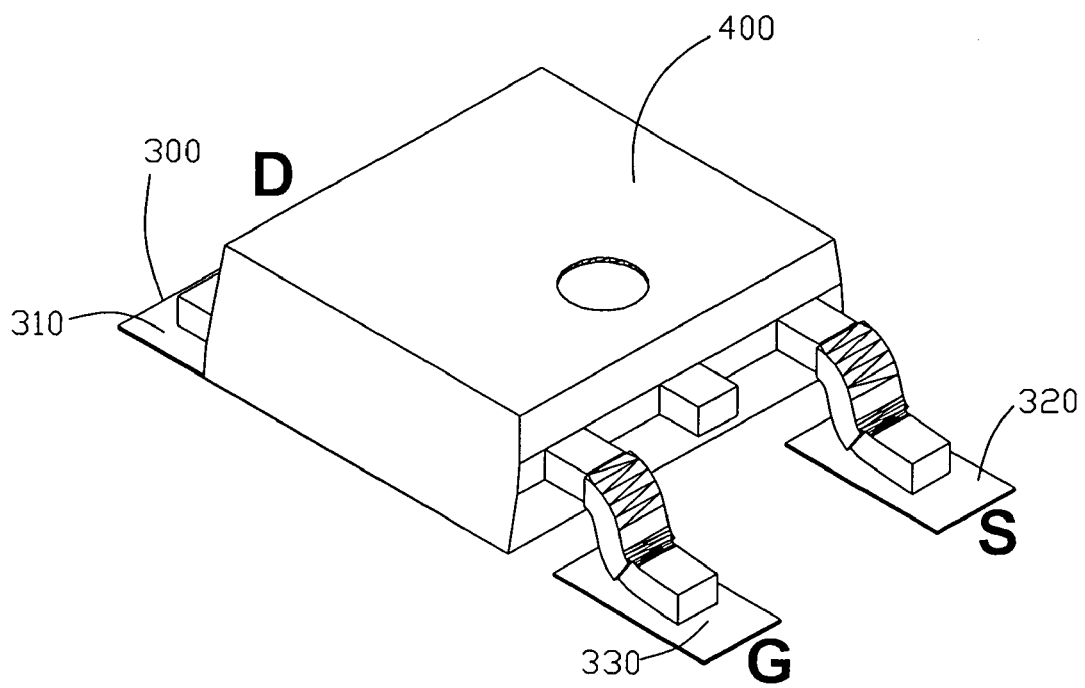
FIG. 4 is a perspective view of a DPAK device surface mounted to the TO 252 land pattern.

A DPAC package 400 is shown mounted to the land pattern 300 in FIG. 4 for comparison purposes.

The high current semiconductor power SOIC device of the invention may be used in many high current applications to replace TO 252 (DPAK) devices. The relatively thick lead frame formed of a single gauge material results in higher assembly yields and allows for an increased number of bonding wires that can be used to thereby reduce package electrical resistance.

It is apparent that the above embodiments may be altered in many ways without departing from the scope of the invention. Further, various aspects of a particular embodiment may contain patentably subject matter without regard to other aspects of the same embodiment. Still further, various aspects of different embodiments can be combined together. Accordingly, the scope of the invention should be determined by the following claims and their legal equivalents.

We claim:

1. A high current semiconductor power SOIC package comprising:
   a relatively thick lead frame formed of a single gauge material having a thickness greater than 8 mils, the lead frame having a plurality of leads and a first lead frame pad, the first lead frame pad including a die soldered thereto;
   a pair of lead bonding areas being disposed in a same plane of a top surface of the die;
   large diameter bonding wires connecting the die to the plurality of leads, the bonding wires being aluminum; and
   a resin body encapsulating the die, the bonding wires, and at least a portion of the lead frame, wherein the die comprises an integrated circuit, the integrated circuit comprises an FET device, and the plurality of leads comprise a source lead, a gate lead, and a drain lead coupled respectively to the FET device's source region, gate region, and drain region, the source lead including a source lead laterally extending portion external to the resin body, and first and second portions external to the resin body and extending perpendicularly from the source lead laterally extending portion in spaced relationship one to the other.

2. The package according to claim 1, wherein the lead frame pad is exposed through the bottom surface of the package.

3. The package according to claim 1, wherein at least one of the plurality of leads is coupled to an integrated circuit terminal by a wireless solder connection.

4. The package according to claim 1, wherein the gate lead includes a gate lead laterally extending portion and a second gate lead portion extending perpendicularly from the gate lead laterally extending portion, the source lead laterally extending portion and the first and second portions and the gate lead laterally extending portion and the second gate lead portion being disposed outside the resin body.

5. The package according to claim 4 wherein the source lead comprises a fused solid piece.

6. The package according to claim 4, wherein the source lead and gate lead are disposed adjacent each other on an opposite side of the semiconductor package from the drain lead.

7. The package according to claim 4, wherein the source lead is coupled to a source bonding area disposed internally of the resin body and the gate lead is coupled to a gate bonding area disposed internally of the resin body, the source bonding area and gate bonding area being disposed in a same plane of a top surface of the FET device, and the bonding wires being relatively short and connecting the source lead to the source bonding area and the gate lead to the gate bonding area.

8. The package according to claim 4, wherein the drain lead comprises a notch for clamping a mold.

9. The package according to claim 4, wherein the drain lead comprises a notch for positioning the package during reflow soldering.

10. The package according to claim 1, wherein the bonding wires have a thickness up to 20 mils.

11. The package according to claim 1, wherein the lead frame further comprises a pair of side tie bars.

12. A flat-leaded high current semiconductor power device SOIC package housing an electronic device comprising:

a relatively thick lead frame formed of a single gauge material having a thickness greater than 8 mils and including a plurality of leads and a lead frame pad, the lead frame pad having the electronic device soldered thereto;

a pair of lead bonding areas disposed in a same plane of a top surface of the electronic device;

bonding wires connecting the electronic device to the plurality of leads, the bonding wires being aluminum wires having a thickness up to 20 mils; and a resin body encapsulating the electronic device, the bonding wires, and at least a portion of the lead frame, and wherein the package has a footprint mountable to a TO 252 land pattern, the die comprises an integrated circuit, the integrated circuit comprises an FET device, and the plurality of leads comprise a source lead, a gate lead, and a drain lead coupled respectively to the FET device's source region, gate region, and drain region, the source lead including a source lead laterally extending portion and first and second portions extending perpendicularly from the source lead laterally extending portion in spaced relationship one to the other.

13. The package of claim 1, wherein the package has a footprint mountable to a TO 252 land pattern.

* * * * *